United States Patent [19]

Honjo

[11] Patent Number: 5,537,061
[45] Date of Patent: Jul. 16, 1996

[54] SEMICONDUCTOR INTEGRATED CIRCUIT HAVING SIGNAL PATHS WITH EQUAL PROPAGATION DELAYS

[75] Inventor: Kazuhiko Honjo, Tokyo, Japan

[73] Assignee: NEC Corporation, Tokyo, Japan

[21] Appl. No.: 460,596

[22] Filed: Jun. 2, 1995

Related U.S. Application Data

[62] Division of Ser. No. 266,587, Jun. 28, 1994, Pat. No. 5,448,208.

[30] Foreign Application Priority Data

Jul. 15, 1993 [JP] Japan ................................ 5-175250
Aug. 23, 1993 [JP] Japan ................................ 5-207489

[51] Int. Cl.$^6$ ............................................. H03K 19/096
[52] U.S. Cl. ............................................. 326/93; 326/101
[58] Field of Search .............................. 326/93, 95, 98, 326/101; 327/293, 295, 292

[56] References Cited

U.S. PATENT DOCUMENTS

| | | | |
|---|---|---|---|
| 4,769,558 | 9/1988 | Bach | 327/292 |
| 4,812,684 | 3/1989 | Yamagiwa et al. | 326/101 |
| 5,140,184 | 8/1992 | Hamamoto et al. | 326/93 |
| 5,172,330 | 12/1992 | Watanabe et al. | 326/101 |
| 5,376,842 | 12/1994 | Honoa et al. | 326/93 |

OTHER PUBLICATIONS

Halliday et al.; "Fundamentals of Physics", 2nd Edition; ©1970, 1974 and 1981 by John Wiley & Sons, Inc.; pp. 484, 485, 594 and 595.

Primary Examiner—Edward P. Westin
Assistant Examiner—Benjamin D. Driscoll
Attorney, Agent, or Firm—Sughrue, Mion, Zinn, Macpeak & Seas

[57] ABSTRACT

A semiconductor integrated circuit has a parallel conductor transmission line including a plurality of signal paths branching at a node. The signal paths have phase compensation sections for creating a phase constant of the transfer constant thereof, where the phase constant is inversely proportional to the length of the signal paths. The phase compensation sections are implemented by covering a microstrip line by a layer having a high dielectric constant or implemented by a second ground conductor disposed opposite to the microstrip conductor with a thin layer of a high dielectric constant. The integrated circuit comprises a plurality of square gate blocks having a plurality of logic gates arranged in an array. A signal source node is connected via respective input signal nodes of the gate blocks to the logic gates in the gate blocks through the respective signal paths having the phase compensation sections.

19 Claims, 7 Drawing Sheets

K = 0~30%

K = 0~2000%

K = -50~500%

5,537,061

SEMICONDUCTOR INTEGRATED CIRCUIT HAVING SIGNAL PATHS WITH EQUAL PROPAGATION DELAYS

This is a divisional of application Ser. No. 08/266,587 filed Jun. 28, 1994 now U.S. Pat. No. 5,448,208.

BACKGROUND OF THE INVENTION

1. Field of the Invention

The present invention relates to a semiconductor integrated circuit having a substantially equal propagation delay. More specifically, it relates to a semiconductor integrated circuit in which a plurality of logic gates receive a signal fed by a common signal source through respective signal paths of a parallel conductor transmission line, and in which a difference in propagation delay or phase delay caused by the difference in length of the signal paths is eliminated for obtaining a speed signal processing.

2. Description of the Related Art

In a conventional semiconductor integrated circuit comprising a parallel conductor transmission line in which inputs of a plurality of logic gates are connected through respective signal paths to an output of a single logic signal source, a signal generated by the logic signal source reaches the plurality of logic gates with certain phase delays. The phase delays differ from logic gate to logic gate depending on the length of the signal paths. Various methods have been used to perform synchronous signal processing at the plurality of logic gates regardless of the differences in the phase delay. For example, timing sequence for signal processing at the plurality of logic gates is controlled and shifted depending on the amount of the phase delay at each of the logic gates. In this method, however, the timing control for each of the logic gates is extremely complicated. Alternatively, the frequency of a timing clock is lowered to allow the logic gates to synchronously carry out the signal processing without being affected by the differences in the propagation delay. In this method, however, a high-speed operation of the semiconductor integrated circuit cannot be obtained.

SUMMARY OF THE INVENTION

In view of the foregoing, it is an object of the present invention to provide a semiconductor integrated circuit having a parallel conductor transmission line in which a high-speed synchronous operation can be obtained among the plurality of logic gates receiving a common logic signal, regardless of the difference of the length of the signal paths.

A wiring structure according to a first aspect of the present invention comprises a semi-insulating substrate having a first dielectric constant and having a first surface and a second surface opposed to the first surface, a parallel conductor transmission line including a first conductor layer having a plurality of signal paths formed on the first surface and a second conductor layer formed on the second surface, and at least one insulator strip layer covering the first conductor layer along one of the plurality of signal paths, the insulator strip layer having a second dielectric constant higher than the first dielectric constant.

A semiconductor integrated circuit according to a second aspect of the present invention comprises a semi-insulating substrate, a co-planar waveguide including a pair of parallel conductors formed on the substrate, the co-planar waveguide having a plurality of signal paths, and at least one insulator strip layer covering the pair of conductors along one of the plurality of signal paths.

A semiconductor integrated circuit according to a third aspect of the present invention comprises: a semi-insulating substrate having a first dielectric constant and having a first surface and a second surface opposed to the first surface; a parallel conductor transmission line including a first conductor layer formed on the first surface, a second conductor layer having a plurality of signal paths and overlying the first conductor layer, and a third conductor layer formed on the second surface, the first and the third conductor layers being maintained at a common potential; and an insulator layer having a second dielectric constant sandwiched between the first and the second conductor layers.

A semiconductor integrated circuit according to a fourth aspect of the present invention comprises a substrate, a signal source node disposed on the substrate, a plurality of gate blocks each including a plurality of logic gates arranged on the substrate, a parallel conductor transmission line including a plurality of signal paths each connected between the signal source node and corresponding one of the plurality of gate blocks, the plurality of signal paths having phase constants substantially inversely proportional to the lengths of the signal paths.

In accordance with the present invention, in a semiconductor integrated circuit having a parallel conductor transmission line including a microstrip conductor and a ground conductor, a thin dielectric strip layer having a high dielectric constant is formed on the upper surface and side surfaces of the microstrip conductor along a signal path of the transmission line, thereby forming a phase compensation section of the signal path. Alternatively, the phase compensation section may be such that a thin insulator layer having a dielectric constant different from that of the semiconductor substrate is formed between the microstrip conductor and a second ground conductor formed on the semiconductor substrate.

With a parallel conductor transmission line in a form of a co-planar waveguide including a pair of parallel conductors formed in a plane, a dielectric strip layer of a high dielectric constant is formed on and along the pair of conductors thereby forming a phase compensation section to increase the capacity between the pair of conductors in accordance with the present invention.

The amounts of phase compensation provided by the phase compensation sections in accordance with the present invention are determined such that the difference in phase delay between the plurality of signal paths is reduced by the phase compensation section. The difference in phase delay is preferably determined such that the phase delays caused by the signal paths connecting a logic signal source with respective logic gates are made substantially equal. In other words, when there are n separate signal paths connecting an output of a single logic signal source and inputs of n logic gates, and the lengths l and the phase constants β of the individual signal paths are assumed as l1, l2, . . . ln and β1, β2 . . . βn, respectively, it is preferred that the product β·l have the same value, i.e., $$l1·\beta1=l2·\beta2= \ldots =ln·\beta n.$$

By the construction as described above, a signal output by the signal source reaches the plurality of logic gates at the same time. Hence, synchronous high-speed operation at the plurality of logic gates can be obtained regardless of the length of the signal paths connecting the logic signal source and the plurality of logic gates.

BRIEF DESCRIPTION OF THE DRAWINGS

The above and other objects, features and advantages of the present invention will be more apparent from the following description, taken in conjunction with the accompanying drawings, in which.

DESCRIPTION OF THE PREFERRED EMBODIMENTS

Figure 1:
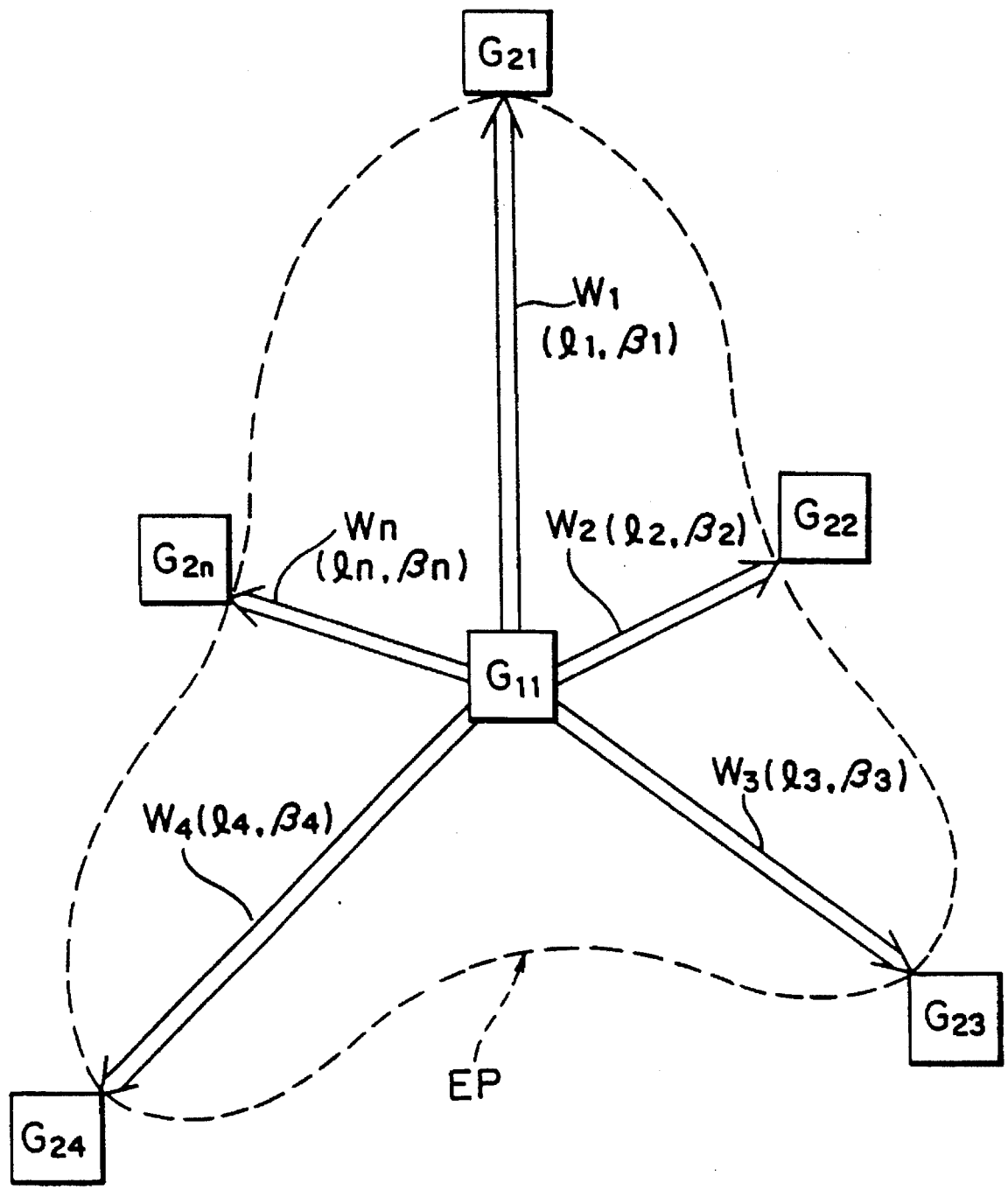
FIG. 1 is a schematic illustration for showing the principle of a function in a semiconductor integrated circuit according to the present invention.

Now, the present invention will be described with reference to the drawings. Referring to FIG. 1, there is schematically shown a semiconductor device in which the principle of the function of the present invention is illustrated. The semiconductor device comprises a logic signal source G11, a plurality of (n, in this example) logic gates G21 to G2n receiving a common signal fed by the logic signal source G11 and signal paths W1 to Wn for connecting the output of the signal source G11 with the inputs of the logic gates G21 to G2n. The signal paths W1 to Wn are shown to have length l1, l2 . . . ln, respectively. Each of the signal paths W1 to Wn has a phase constant $\beta$ ($\beta1$ to $\beta n$), which is the imaginary part of the propagation constant $\gamma = \alpha + j\beta$ of the signal path.

In a preferred embodiment, the phase constant $\beta$ of each of the signal paths is designed so that the following equation:

$$\beta 1 \cdot l1 = \beta 2 \cdot l2 = \ldots = \beta n \cdot ln. \tag{1}$$

is substantially satisfied for all of the signal paths W1 to Wn. In FIG. 1, the broken curve EP as shown connecting all of the inputs of the n logic gates G21 to G2n designates an equiphase plane (plane of equal delay). In other words, the phase constants $\beta1$ to $\beta n$ are determined in relation to the length l1 to ln of the signal paths, in accordance with the preferred embodiment of the present invention, so that the inputs of all of the logic gates G21 to G2n are located in the equiphase plane EP.

Referring to FIGS. 2A to 2E, there are shown various wiring structures illustrative of the function of the signal paths of a parallel conductor transmission line according to the principle of the present invention. The wiring structures of FIGS. 2B to 2E are called in this text wave-delaying sections or phase compensation sections. The wiring structures depicted in FIG. 2A to FIG. 2D are examples of a parallel conductor transmission line including a microstrip conductor 11 and one or two ground conductors 12, 13. In each of FIGS. 2A to 2D, a microstrip conductor 11 is formed on or above a main surface of a semi-insulating GaAs substrate 14 having a dielectric constant $\epsilon_r$, $\epsilon_r=12.7$ for example, on the back surface of which is formed a ground conductor 12. Lines of the electric force are illustrated as denoted by the reference numeral 18 in these drawings for a better understanding of difference in dielectric constant.

Figure 2A:
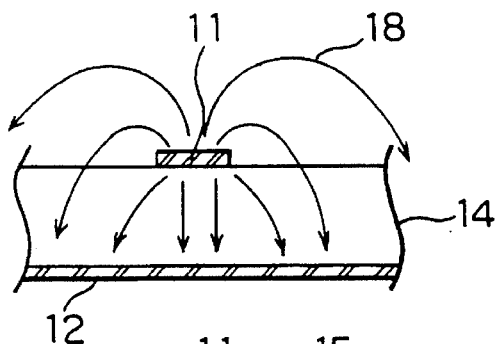
FIGS. 2A to 2E are schematic cross-sectional views illustrative of a conventional wiring structure and inventive wiring structures each having a wave-delaying (phase compensation) function according to embodiments of the present invention.

In FIG. 2A, there is shown a standard wiring structure of a parallel transmission line which is generally used in a conventional integrated circuit and which is also used in this embodiment as it is or in a modified structure. The parallel conductor transmission line of FIG. 2A includes a microstrip conductor 11 and a ground conductor 12 disposed opposite to the microstrip conductor 11 with a GaAs semi-insulating substrate 14 sandwiched therebetween.

The phase constant $\beta$ of the parallel conductor transmission line is determined by a capacitance C per unit length and an inductance L per unit length as $\beta = \omega\sqrt{LC}$ at a predetermined frequency. Both L and C are determined by the structure and relative position of both the conductors 11 and 12 and the dielectric constant $\epsilon_r$ of the GaAs substrate 14. The phase constant of each of the phase compensation sections shown in FIGS. 2B–2E can be normalized as a wave-delaying rate K using the phase constant of the standard wiring structure:

$$K = (\beta'/\beta_o - 1) \times 100\%$$

wherein $\beta'$ is a phase constant of one of the structures of FIGS. 2B to 2E to be normalized and $\beta_o$ is the phase constant of the standard wiring structure.

Figure 2B:
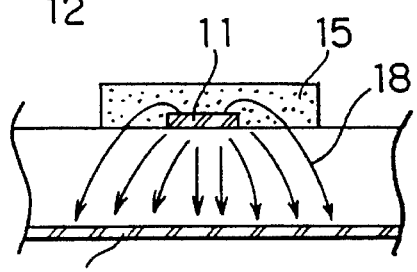

In FIG. 2B, a thin layer 15 of $Ta_2O_5$ is formed additionally to the structure of FIG. 2A, surrounding the microstrip conductor 11 at the upper and side surfaces thereof. The thin layer 15 of $Ta_2O_5$ has a high dielectric constant $\epsilon_r=25$, so that the number of the lines 18 of the electric force is increased in the substrate as shown in FIG. 2B. The effective phase constant $\beta'$ in the structure of FIG. 2B can be larger than the standard phase constant $\beta_o$ in the structure of FIG. 2A. This is because the capacitance C per unit length increases while the inductance per unit length is unchanged by employing the structure of FIG. 2B as compared to the structure of FIG. 2A. The wave-delaying rate K can be adjusted between 0 and 30% in accordance with the structure of FIG. 2B by selecting the thickness and the width of the thin layer 15 of $Ta_2O_5$.

Figure 2C:
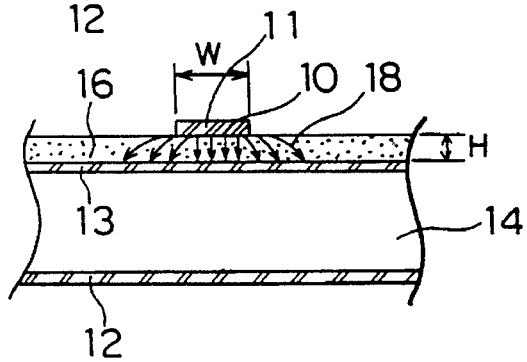
Figure 2D:
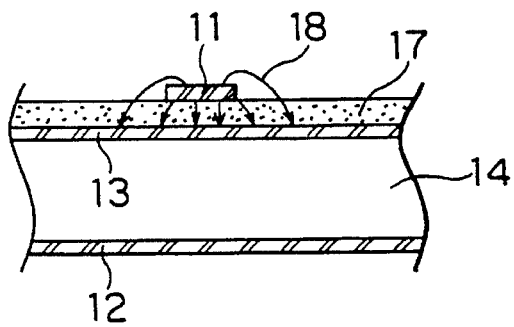

In FIG. 2C, a second ground conductor 13 and a thin layer 16 of $Ta_2O_5$ are formed between the microstrip conductor 11 and the GaAs substrate 14. The thickness H of the $Ta_2O_5$ layer 16 having a high dielectric constant $\epsilon_r=25$ can be adjusted depending on a desired wave-delaying rate. In this structure, the wave-delaying rate K can be adjusted between 0% and 2000% by controlling the thickness H of the $Ta_2O_5$ layer 16. FIG. 2D shows the same structure as the structure of FIG. 2C except that the layer 17 underlying the microstrip conductor 11 is made of polyimide having a low dielectric constant $\epsilon_r=3$. In FIG. 2D, the wave-delaying rate K can be adjusted to a negative value (relative to that of the structure shown in FIG. 2A) and can be adjusted between −50 and 500% by controlling the thickness of the polyimide layer.

Figure 2E:
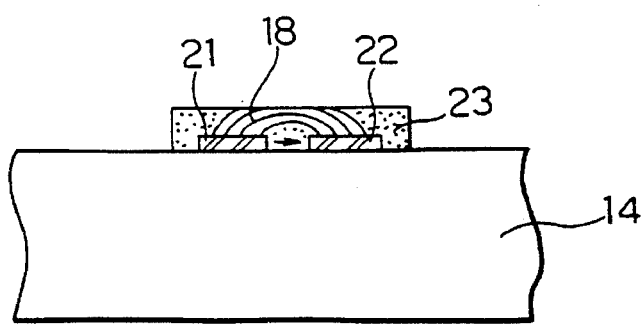

FIG. 2E is an example of a phase compensation section in a parallel conductor transmission line including a pair of parallel conductors 21 and 22 formed in a plane, generally called co-planar waveguide. The phase compensation section includes a insulator strip layer 23 covering the pair of conductors 21 and 22 additionally to a standard wiring structure of this type for thereby increasing the capacity of the pair of conductors.

Figure 3:
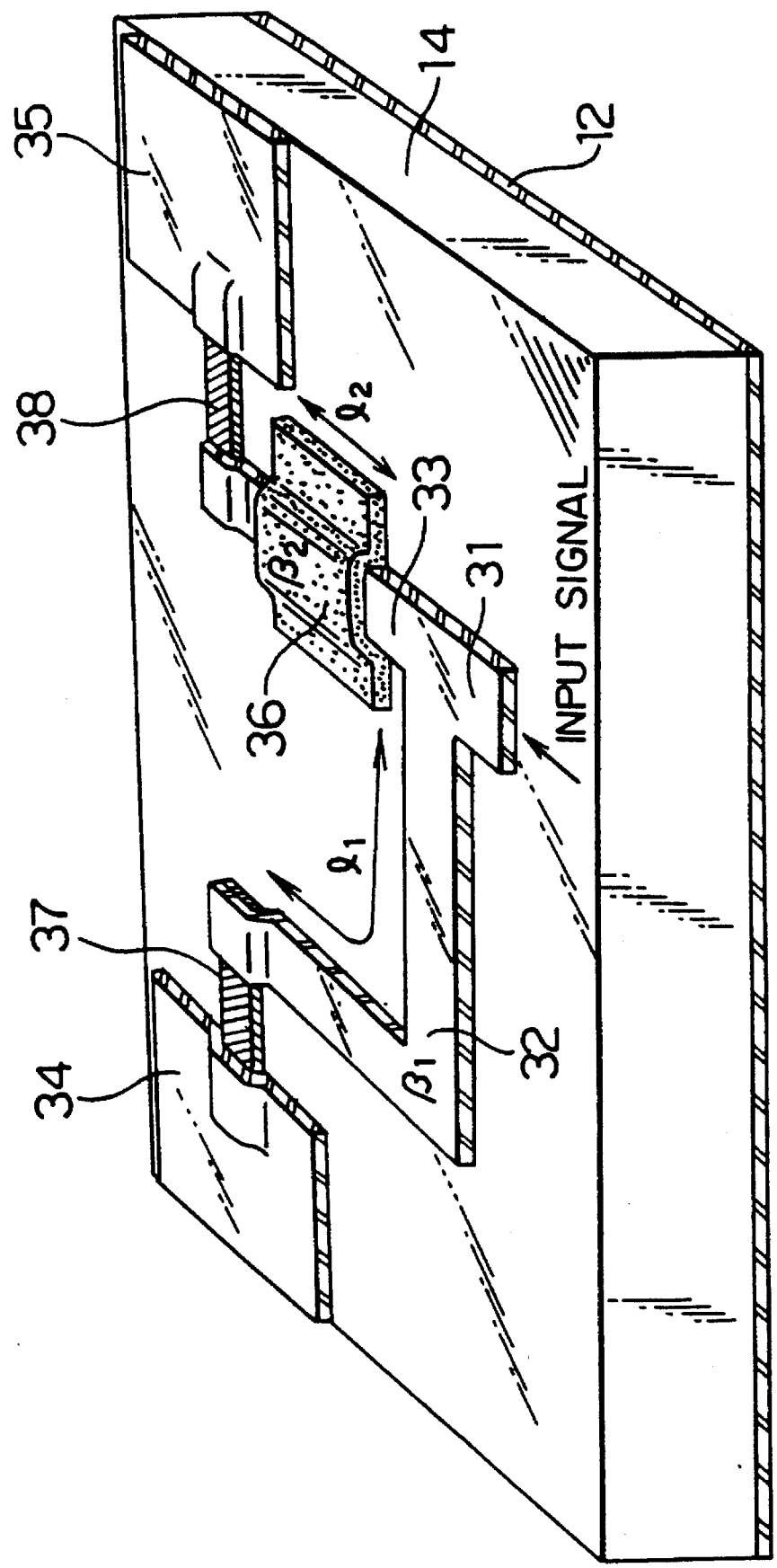
FIG. 3 is a schematic perspective view illustrative of a semiconductor integrated circuit according to an embodiment of the present invention.

Referring to FIG. 3, there is shown an exemplary detailed structure of a semiconductor integrated circuit according to an embodiment of the present invention, in which the wiring structure of FIG. 2A and the wave-delaying section of FIG. 2B is used. In the circuit shown by FIG. 3, an input signal shown by an arrow is fed by a signal source not illustrated in the drawing to a node 31 of a microstrip conductor, the microstrip conductor branching at the node 31 to a first signal path 32 and a second signal path 33. Both the other ends of the first and the second signal paths 32 and 33 are connected to a first and a second electrodes 34 and 35 of a first and a second logic gates, respectively, formed within the semiconductor substrate 14. The length l1 and l2 of the first and the second signal paths 32 and 33 have, as shown in the drawing, the following relationship:

$$l1 > l2.$$

Hence, the phase constants β1 and β2 of the two signal paths should have the relationship according to the present invention:

$$\beta1 < \beta2.$$

Here, the phase constants β1 and β2 can be selected in accordance with the preferred embodiment to substantially satisfy the equation:

$$l1 \cdot \beta1 = l2 \cdot \beta2,$$

which can be rewritten as follows:

$$\beta2 = (l1/l2) \cdot \beta1. \quad (2)$$

The equation (2) is then normalized in terms of wave-delaying rate K2 of the second signal path as follows:

$$K2 = (l1/l2 - 1) \times 100\%.$$

To obtain the above wave-delaying rate K2, a phase compensation section implemented by a thin layer 36 of $Ta_2O_5$ is provided along the second signal path 33 constituting a microstrip conductor. In this case, the characteristic impedance Z1 of the first signal path 32 is expressed as follows:

$$Z1 = \sqrt{L/C1} \quad (3)$$

wherein L is the inductance per unit length of the signal paths 32 and 33 of the parallel conductor transmission line. The characteristic impedance Z2 of the second signal path 33 is expressed as follows:

$$Z2 = \sqrt{L/C2}. \quad (4)$$

The capacitance C1 per unit length of the first signal path 32 is lower than the capacitance C2 per unit length of the second signal path 33, so that the characteristic impedances Z1 is larger than the characteristic impedance Z2. Accordingly, in this embodiment, the first electrode 34 is provided at its receiving end with a nonreflective terminal resistor 37 having a resistance R1 which satisfies the following equation:

$$R1 = Z1.$$

Similarly, the second electrode 35 is provided at its receiving end with a nonreflective terminal resistor 38 having a resistance R2 which satisfies the following equation:

$$R2 = Z2.$$

These resistors R1 and R2 can prevent reflection of signals transmitted by the parallel conductor transmission line. Each of the resistors 37 (R1) and 38 (R2) is formed of a thin film of, for example, WSiN.

Figure 4A:
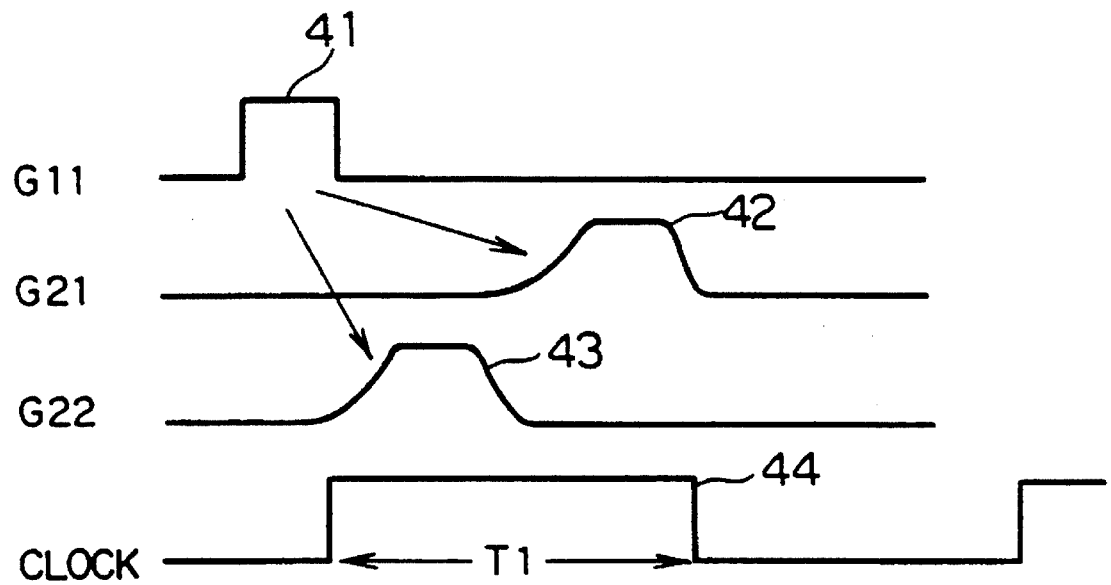
FIGS. 4A and 4B are timing charts for illustrating phase delays in a conventional circuit and an inventive circuit according to an embodiment of the present invention, respectively.
Figure 4B:
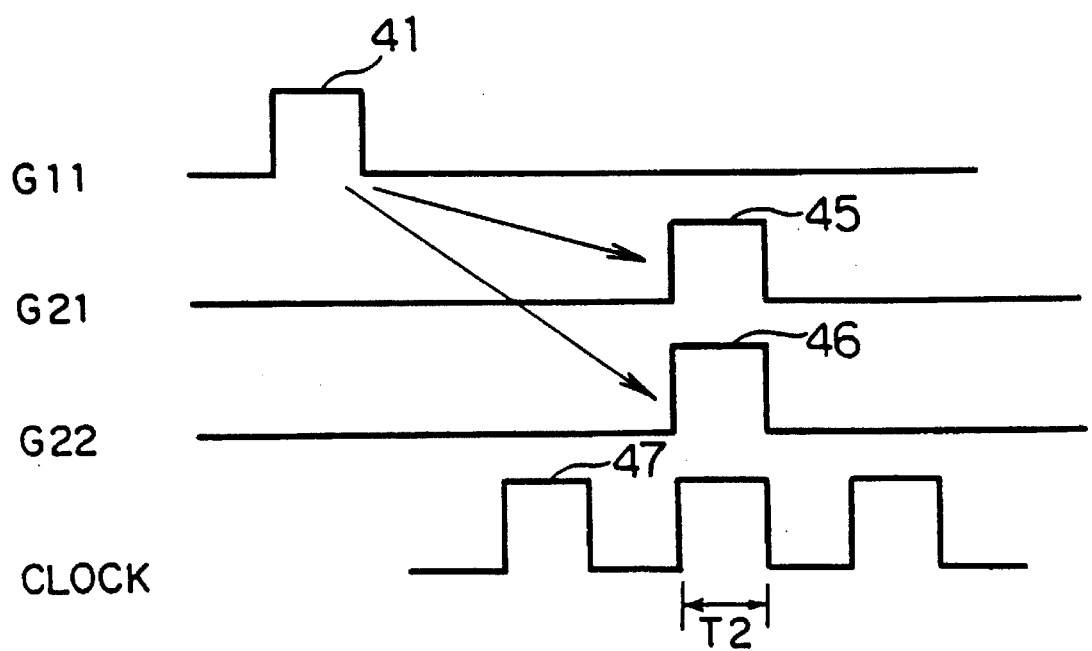

FIGS. 4A and 4B are exemplary timing charts showing waveforms of signals in a conventional semiconductor integrated circuit and waveforms of signals in the semiconductor integrated circuit according to the inventions, respectively.

In FIG. 4A, with the conventional semiconductor integrated circuit, a signal 41 output from the signal source G11 (such as shown in FIG. 1) arrives at the logic gates G21, G22 at different instants. The pulse duration T1 of each clock signal 44 is selected to be long enough to include both the durations of the output signals 42 and 43 fed by the logic gates G21 and G22, in order to carry out a correct logical operation based on the output signals 42 and 43 of both the logic gates G21 and G2. On the contrary, in FIG. 4B, with the semiconductor integrated circuit according to the embodiment, a signal output from the signal source G11 arrives at the logic gates G21 and G22 substantially at the same time. Accordingly, the pulse duration T2 of each clock pulse 47 can be reduced because of a simultaneous output signal 45 and 46 fed by the logic gates G21 and G22.

Figure 5:
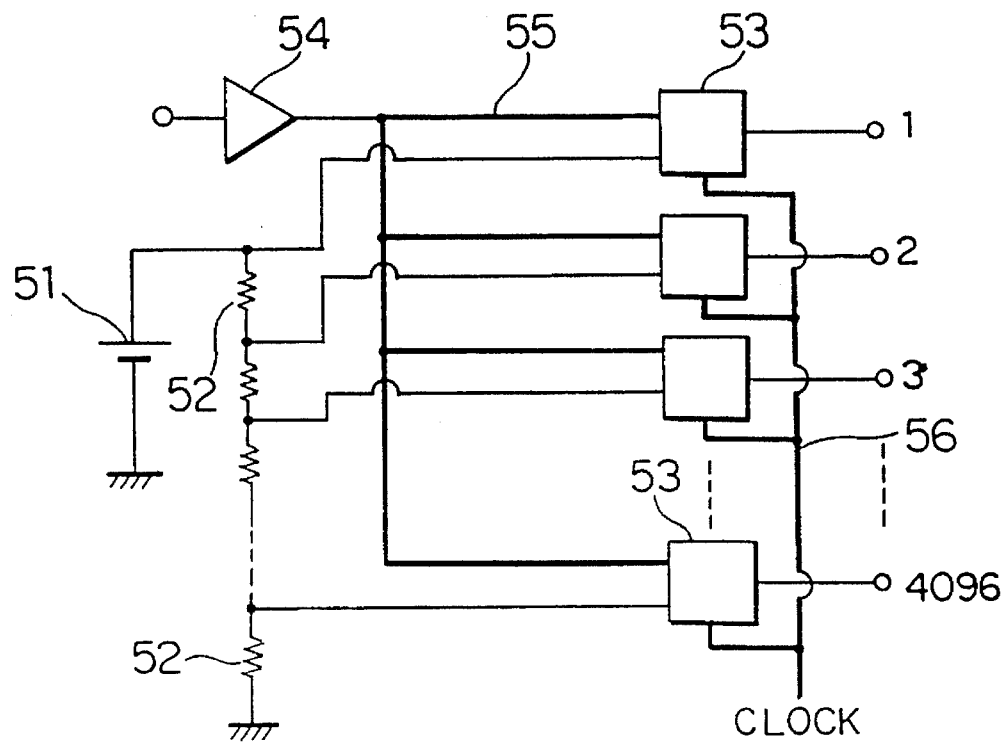
FIG. 5 is a schematic diagram showing an analog-to-digital converter according to an embodiment of the present invention in which phase compensation sections are used.

FIG. 5 is a block diagram showing a semiconductor integrated circuit implementing a parallel analog-to-digital converter (ADC), in which the wave-delaying sections are used in accordance with the present invention. The parallel ADC comprises a battery 51 for supplying a maximum reference voltage, a set of resistors 52 for supplying respective reference voltages by dividing the output of the battery 51, and latched comparators 53 forming an output section. Each of the latched comparators 53 receives the output of an analog amplifier 54 from corresponding signal path 55 and a clock signal through a common clock line 56. The analog signal fed by the analog amplifier 54 is transformed to a proportional digital number by the ADC and output through the latched comparators 53.

In general, the more is the bit number of the parallel ADC, the more of the number is required for the comparators 53. Accordingly, the lengths of the signal paths differ from comparator to comparator depending on the location thereof. Hence, a conventional parallel ADC cannot operate in a high-speed due to the difference in phase delay. However, in this embodiment, the wave-delaying sections introduced to the respective signal paths 55 and clock lines 56 as depicted by the thick solid lines in FIG. 5 enable a simultaneous operation at the large number of comparators 53 regardless of the difference in propagation distance. As a result, a full 13-bit parallel ADC having a conversion speed of 10 Gbps (Gb/sec) can be obtained.

Figure 6:
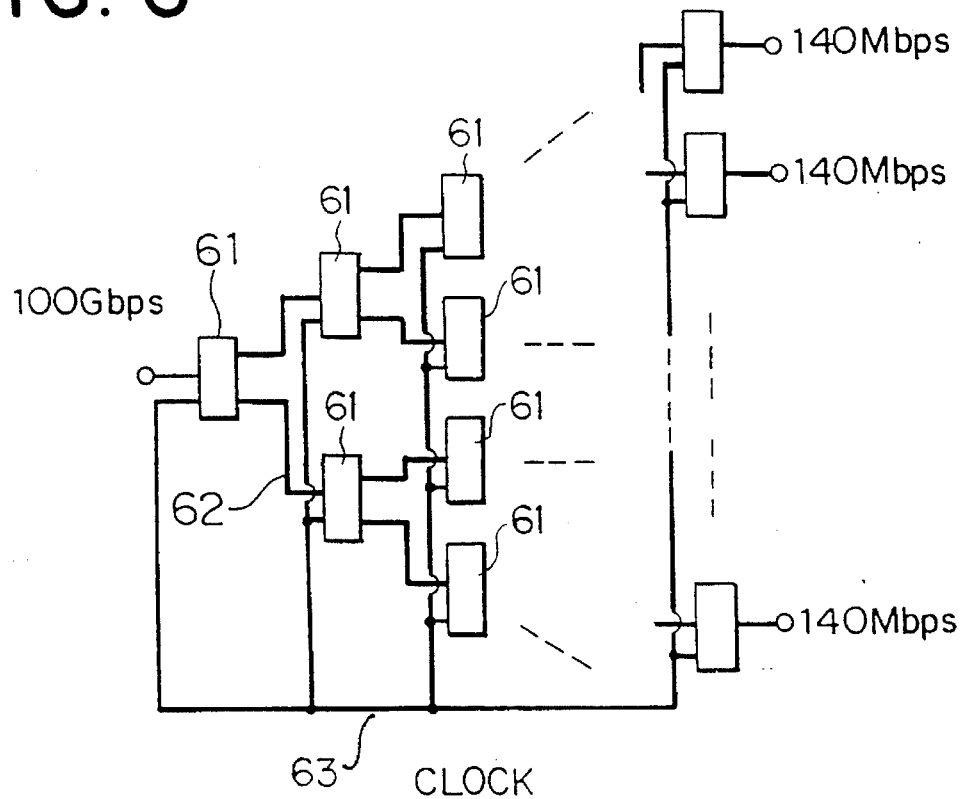
FIG. 6 is a block diagram showing a demultiplexer (multiplexer) according to an embodiment of the present invention in which phase compensation sections are used.

FIG. 6 is a block diagram showing a semiconductor device implementing a demultiplexer (or multiplexer) in which the wave-delaying sections are used in accordance with the present invention. In the circuit shown in FIG. 6, the wave-delaying sections are provided to the signal lines 62 and a common clock signal line 63 connected to Flip-Flops 61 and shown as thick solid lines. By employing this construction, a demultiplexer having an operational speed of more than 100 Gbps can be obtained.

Figure 7:
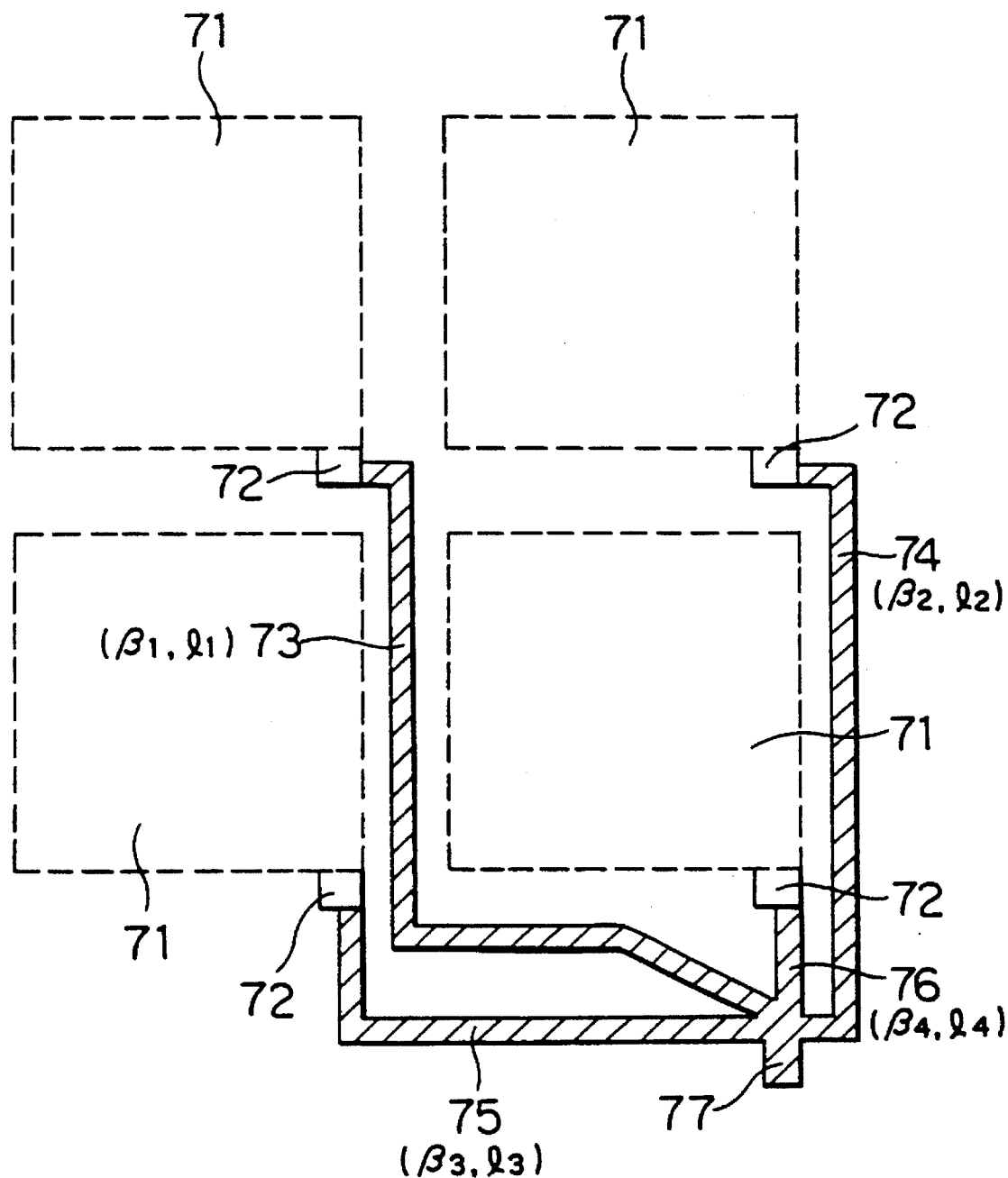
FIG. 7 is a schematic plan view showing an LSI having signal paths in accordance with another embodiment of the present invention.

Yet another embodiment of the present invention will now be described with reference to FIG. 7 which shows an arrangement of circuit blocks and interconnections in a portion of an LSI. As shown in FIG. 7, a large number of logic gates on a substrate are divided and arrayed in a plurality of logic gate blocks, including four gate blocks 71 as shown in FIG. 7, each having a square shape. Gate blocks are arranged such that the centers of each four blocks 71 are located at the four apexes of an unillustrated square.

The gate blocks 71 are provided with logic signal input terminals 72, respectively. The logic signal input terminals 72 are connected to respective signal paths 73 to 76 of a parallel conductor transmission line branching at a node (or a signal source) 77. Each of the input terminals 72 is located adjacent to the bottom right corner of the corresponding square gate block 71. The common node 77 is located below the input terminal 72 of the lower-right block 71 as viewed in FIG. 7.

Assuming that the phase constants and the lengths of the signal paths are $\beta 1$ and $l1$ for signal path 73, $\beta 2$ and $l2$ for signal path 74, $\beta 3$ and $l3$ for signal line 75 and $\beta 4$ and $l4$ for signal path 76, the inequality $l1>l2>l3>l4$ and $\beta 1<\beta 2<\beta 3<\beta 4$ hold. Since the logic gate blocks 71 are disposed in an array as shown in the drawing, the length of each of the signal paths 73 to 76 extending from the common node (signal source) 77 to the input terminal 72 of each gate block 71 becomes substantially a multiple of the grid length of the arrays of the gate blocks. In this case, an ideal condition for obtaining an equal phase delay in propagation of a signal from the common node 77 to the logic signal input terminals 72 of the blocks 71 is obtained when the following equation hold:

$$\beta 1 \cdot l1 = \beta 2 \cdot l2 = \beta 3 \cdot l3 = \beta 4 \cdot l4. \tag{5}$$

By employing the arrangement of the circuit blocks according to the above embodiment of FIG. 7, a preferable condition for obtaining an equal phase delay can be readily obtained because the ratio of phase constants has a discreet value.

Figure 8:
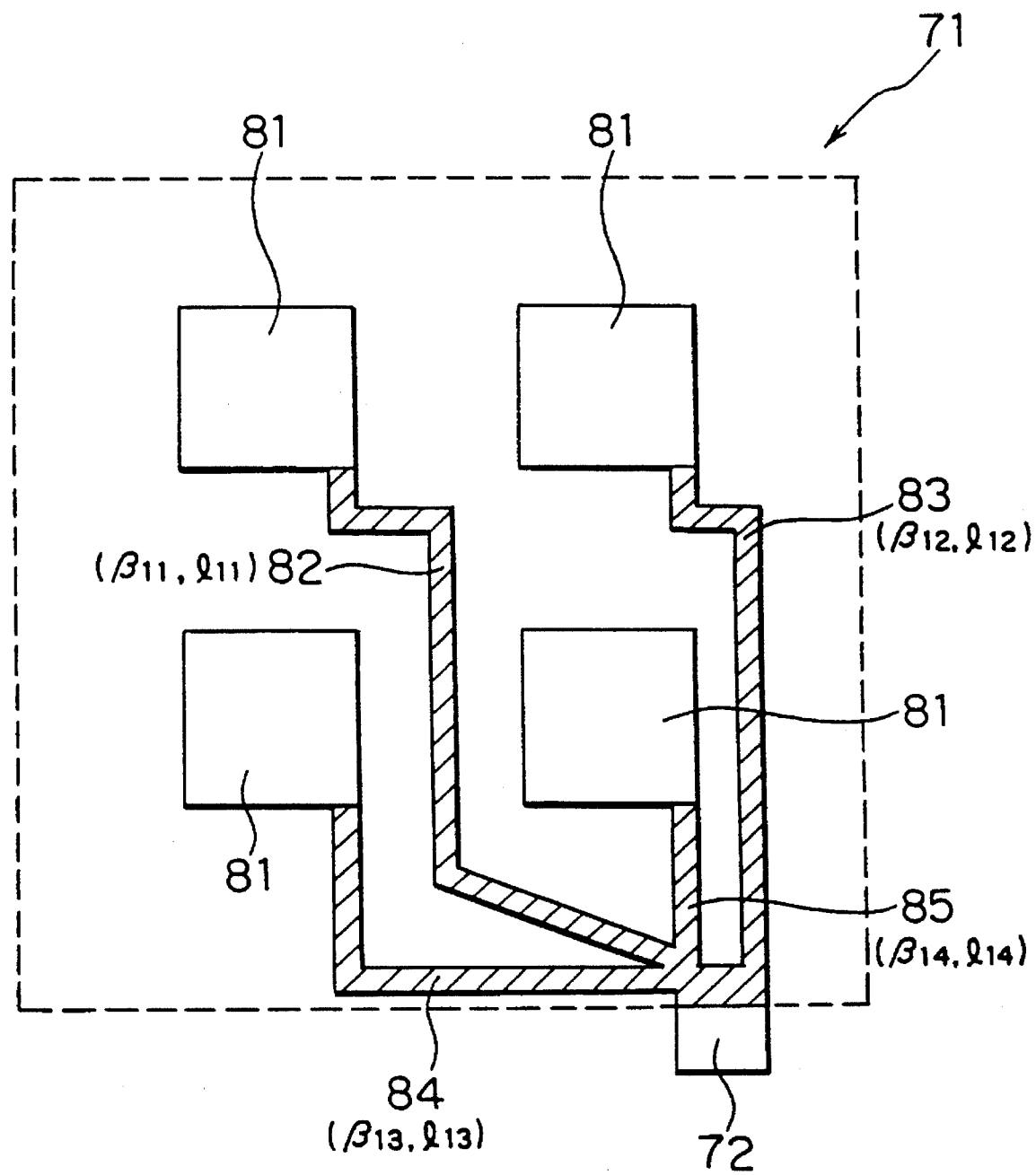
FIG. 8 is a schematic plan view of the gate block of FIG. 7.

FIG. 8 shows the arrangement of logic gates disposed in the gate block shown in FIG. 7. Since the arrangement of logic gates in one of the gate blocks 71 of FIG. 7 is the same as another of the gate blocks, the structure of one of the gate blocks 71 is shown in FIG. 8. Logic gate block 71 is composed of four logic gates 81 disposed in an array. The centers of these four logic gates 81 are located at four apexes of an unillustrated square. The input terminal 72 of the logic gate block 71 is connected to the inputs of four logic gates 81 via respective signal paths 82 to 85. In the drawing, the phase constants $\beta$ and the lengths $l$ of the signal paths are $\beta 11$ and $l11$ for signal path 82, $\beta 12$ and $l12$ for signal path 83, $\beta 13$ and $l13$ for signal path 84 and $\beta 14$ and $l14$ for signal path 85, respectively, and the inequalities $l11>l12>l13>l14$ and $\beta 11<\beta 12<\beta 13<\beta 14$ hold in accordance with the present invention.

In FIG. 8, each of the signal paths 82 to 85 has the lengths substantially equal to a multiple of the grid length of the arrays of the logic gates. Hence, the phase constant of the signal path 82 to 85 is readily determined by calculating the value thereof using the inversely proportional relationship between the length and the phase constant based on the grid length. In detail, delays in propagation of signals from the input terminal 72 to the respective logic gates 81 become the same when the following equations hold:

$$\beta 11 \cdot l11 = \beta 12 \cdot l12 = \beta 13 \cdot l13 = \beta 14 \cdot l14. \tag{6}$$

In accordance with the embodiment of FIGS. 7 and 8, it is readily obtained to equalize delays in propagation of signals from the signal source to the input terminals of the gate blocks and delays from the input terminal of each gate block to the logic gates therein. Therefore, propagation delays of signals transmitted from the signal source to the gates disposed in an array can be made substantially the same throughout the LSI chips.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor integrated circuit, comprising:

a substrate;

a signal source node disposed on said substrate;

a plurality of gate blocks including a plurality of logic gates arranged on said substrate; and a parallel conductor transmission line including a first conductor and a second conductor extending parallel to each other, said first conductor having a plurality of signal paths each connected between said signal source node and corresponding one of said plurality of gate blocks, said plurality of signal paths having phase constants inversely proportional to the lengths of said signal paths.

2. A semiconductor integrated circuit as defined in claim 1 wherein the centers of each four of said plurality of gate blocks are located substantially at four apexes of a square.

3. A semiconductor integrated circuit as defined in claim 2 wherein each of said gate blocks has a signal input node connected to one of said plurality of signal paths, at least four logic gates located substantially at apexes of a square, and a second parallel conductor transmission line including second signal paths correspondingly to said four logic gates, said second signal paths having phase constants inversely proportional to the lengths of said second signal paths.

4. The semiconductor integrated circuit as defined in claim 1, wherein each of said plurality of signal paths produces substantially the same phase delay.

5. The semiconductor integrated circuit as defined in claim 1, wherein said substrate has a first surface and a second surface opposed to said first surface, and wherein said first conductor is formed on said first surface, and said second conductor is formed on said second surface, and wherein said parallel conductor transmission line further includes at least one high-impedance strip layer covering at least one of said plurality of signal paths.

6. The semiconductor integrated circuit as defined in claim 1, wherein said parallel conductor transmission line is implemented by a ground conductor formed on said substrate, a high-impedance layer formed on said ground conductor, and a microstrip conductor formed on said high-impedance layer and including a plurality of portions each corresponding to one of said plurality of signal paths.

7. The semiconductor integrated circuit as defined in claim 1, wherein the product of the phase constant and the length of each of said signal paths is the same.

8. A semiconductor integrated circuit comprising:

a substrate;

a signal source node disposed on said substrate;

a plurality of gate blocks including a plurality of logic gates arranged on said substrate; and a parallel conductor transmission line including a plurality of signal paths overlying said substrate, each of said plurality of signal paths connected between said signal source node and a corresponding one of said plurality of gate blocks, said plurality of signal paths including a first signal path and a second signal path, said first signal path having a first length and a first phase constant at a certain frequency, said second signal path having a second length shorter than said first length and a second phase constant at said certain frequency, said second phase constant being larger than said first phase constant.

9. The semiconductor integrated circuit as defined in claim 8, wherein the product of the phase constant and the length of each of said signal paths is the same.

10. The semiconductor integrated circuit as defined in claim 8, wherein a first phase delay produced by said first signal path is substantially the same as a second phase delay produced by said second signal path.

11. The semiconductor integrated circuit as defined in claim 8, wherein said substrate has a first surface and a second surface opposed to said first surface, and wherein said parallel conductor transmission line includes a first conductor layer formed on said first surface, a second conductor layer formed on said second surface, said second conductor layer implementing said plurality of signal paths, and a first high-impedance strip layer and a second high-impedance strip layer covering said first signal path and said second signal path, respectively.

12. The semiconductor integrated circuit as defined in claim 11, wherein said first high-impedance strip layer is different from said second high-impedance strip layer in at least one of width and thickness thereof.

13. The semiconductor integrated circuit as defined in claim 11, wherein a first phase delay produced by said first signal path is substantially the same as a second phase delay produced by said second signal path.

14. The semiconductor integrated circuit as defined in claim 8, wherein said parallel conductor transmission line is implemented by a co-planar waveguide including a pair of parallel conductors formed on said substrate and implementing said plurality of signal paths and a plurality of high-impedance strip layers each covering a portion of said pair of conductors along one of said plurality of signal paths, said plurality of high-impedance strip layers including a first high-impedance strip layer and a second high-impedance strip layer covering said first signal path and said second signal path, respectively.

15. The semiconductor integrated circuit as defined in claim 14, wherein said first high-impedance strip layer is different from said second high-impedance strip layer in at least one of width and thickness thereof.

16. The semiconductor integrated circuit as defined in claim 15, wherein a first phase delay produced by said first signal path is substantially the same as a second phase delay produced by said second signal path.

17. The semiconductor integrated circuit as defined in claim 8, wherein said parallel conductor transmission line is implemented by a ground conductor formed on said substrate, a high-impedance layer formed on said ground conductor, and a microstrip conductor formed on said high-impedance layer and including a plurality of portions each corresponding to one of said plurality of signal paths.

18. The semiconductor integrated circuit as defined in claim 17, wherein said high-impedance layer has a dielectric constant higher than the dielectric constant of said substrate.

19. The semiconductor integrated circuit as defined in claim 17, wherein a phase delay produced by said first signal path is substantially the same as a second phase delay produced by said second signal path.

* * * * *

UNITED STATES PATENT AND TRADEMARK OFFICE
CERTIFICATE OF CORRECTION

PATENT NO. : 5,537,061
DATED : July 16, 1996
INVENTOR(S) : Kazuhiko HONJO

It is certified that error appears in the above-indentified patent and that said Letters Patent is hereby corrected as shown below:

Column 6, line 23, delete "G2" and insert -- G22 --.

Signed and Sealed this

Twenty-sixth Day of November 1996

Attest:

BRUCE LEHMAN

*Attesting Officer*   *Commissioner of Patents and Trademarks*